(12) United States Patent
Weber (10) Patent No.: US 9,649,733 B2
(45) Date of Patent: May 16, 2017

(54) METHODS FOR SECURING FEATURES TO HOUSINGS

(71) Applicant: Apple Inc., Cupertino, CA (US)

(72) Inventor: Douglas Joseph Weber, Arcadia, CA (US)

(73) Assignee: Apple Inc., Cupertino, CA (US)

( * ) Notice: Subject to any disclaimer, the term of this patent is extended or adjusted under 35 U.S.C. 154(b) by 406 days.

(21) Appl. No.: 14/135,391

(22) Filed: Dec. 19, 2013

(65) Prior Publication Data

US 2014/0109382 A1    Apr. 24, 2014

Related U.S. Application Data (62) Division of application No. 12/127,752, filed on May 27, 2008, now Pat. No. 8,646,637.

(Continued)

(51) Int. Cl.
| | | |
|---|---|---|
| *B23P 19/04* | (2006.01) | |
| *B32B 37/02* | (2006.01) | |
| *B32B 38/04* | (2006.01) | |
| *H05K 5/02* | (2006.01) | |
| *B29C 45/14* | (2006.01) | |

(Continued)

(52) U.S. Cl.
CPC ........ *B23P 19/04* (2013.01); *B29C 45/14311* (2013.01); *B29C 45/14811* (2013.01); *B32B 37/02* (2013.01); *B32B 38/04* (2013.01); *H05K 5/02* (2013.01); *H05K 5/0217* (2013.01); *B29C 45/14344* (2013.01); *B29C 45/1657* (2013.01); *B29C 45/1671* (2013.01); *B29C 2045/14327* (2013.01); *B29K 2705/00* (2013.01); *B29L 2031/3481* (2013.01); *B32B 2038/047* (2013.01); *B32B 2457/00* (2013.01); *B32B 2553/00* (2013.01); *Y10T 29/4998* (2015.01);

(Continued)

(58) Field of Classification Search
CPC .... B23P 11/00; B23P 19/04; Y10T 29/49936; Y10T 29/49945; Y10T 29/4998; Y10T 428/24289; Y10T 428/24008; H05K 5/0217; H05K 5/02; B29C 45/14311; B29C 45/14811; B29C 45/1657; B29C 45/1671; B29C 2045/14327; B29C 45/14344; B32B 38/04; B32B 37/02; B29K 2705/00; B29L 2031/3481
USPC .......................................... 29/896.61, 896.62
See application file for complete search history.

(56) References Cited

U.S. PATENT DOCUMENTS 1,335,975 A *   4/1920   Layne ................... E21B 43/088
                                                        166/233
1,829,630 A *  10/1931   Bolton ...................... B02C 2/10
                                                        241/294

(Continued)

*Primary Examiner* — David Bryant
*Assistant Examiner* — Lawrence Averick
(74) *Attorney, Agent, or Firm* — Downey Brand LLP (57) ABSTRACT

A housing for an electronic device as well as methods for forming the housing are disclosed. The housing can be formed from a substrate having perforations to assist in adhering components internal to the housing. The substrate is typically a multi-layer substrate having at least two layers. In one embodiment, an inner layer of the multi-layer substrate can be provided with perforations. The perforations can them be used to adhere internal features to the multi-layer substrate. The internal features can be used for attaching parts or components to the multi-layer substrate, thereby securing the parts or components to the multi-layer substrate and thus the housing.

20 Claims, 5 Drawing Sheets

Related U.S. Application Data (60) Provisional application No. 61/046,260, filed on Apr. 18, 2008.

(51) Int. Cl.
*B29L 31/34* (2006.01)
*B29C 45/16* (2006.01)
*B29K 705/00* (2006.01)

(52) U.S. Cl.
CPC .............. *Y10T 428/24008* (2015.01); *Y10T 428/24289* (2015.01)

(56) References Cited

U.S. PATENT DOCUMENTS

| | | | | |
|---|---|---|---|---|
| 5,385,327 A * | 1/1995 | Hegarty | ............... | A47B 21/045 248/442.2 |
| 5,775,046 A * | 7/1998 | Fanger | ................... | A47B 81/06 108/157.16 |
| 6,411,029 B1 * | 6/2002 | Czak | ................... | B29C 45/1418 313/509 |
| 6,896,756 B2 * | 5/2005 | Ishii | ................. | B29C 45/14811 156/219 |
| 2003/0012032 A1 * | 1/2003 | Kreutzer | .............. | B60Q 1/2611 362/542 |
| 2008/0103637 A1 * | 5/2008 | Bliven | ...................... | F16B 2/20 701/1 |
| 2009/0017242 A1 * | 1/2009 | Weber | ................. | B29C 37/0082 428/35.7 |
| 2009/0022957 A1 * | 1/2009 | Aso | ................... | B29C 45/14688 428/160 |
| 2011/0318545 A1 * | 12/2011 | Goto | ................... | B29C 45/1418 428/195.1 |
| 2012/0234791 A1 * | 9/2012 | Weber | ................. | B29C 37/0082 216/39 |

* cited by examiner

METHODS FOR SECURING FEATURES TO HOUSINGS

CROSS-REFERENCE TO RELATED APPLICATION

This is a divisional of U.S. patent application Ser. No. 12/127,752 filed May 27, 2008 entitled "Perforated Substrates For Forming Housings", which claims priority to U.S. Provisional Patent Application No. 61/046,260, filed Apr. 18, 2008, entitled "Perforated Substrates For Forming Housings", which are incorporated herein by reference.

BACKGROUND OF THE INVENTION

Field of the Invention

The present invention relates to forming housing for electronic devices.

Description of the Related Art

The manufacture of devices that include metal parts often includes the formation of features, e.g., complex mechanical structures, on surfaces of the metal parts. In order to ensure the structural integrity of such features, the features are often affixed to the surfaces of the metal parts using an adhesive material. By way of example, an internal feature has been obtained and glued in an appropriate location on a surface of a metal parts or housings.

Alternatively, internal features have been welded to the surface of metal parts or housings. Utilizing a welding process to attach internal features to metal parts is limiting in terms of the number and the complexity of the internal features that is possible using a welding technique. Furthermore, the cosmetic quality of a metal part may be degraded as a result of a welding process. For instance, the heat associated with a welding process may alter the shape and/or the color of a metal part.

Internal features may also be formed using an injection molding process. When a manufacturing process includes an injection molding process, a through-hole may be formed in a metal part or housing, and a plastic or a resin may be injected through the through-hole. The plastic or resin may form a feature on one side of the metal part, e.g., a metal sheet, while additional plastic or resin may form an undercut on the other side of the metal sheet. The undercut, in cooperation with the plastic or resin that hardens in the through-hole, may effectively serve to anchor or otherwise hold the feature in place. Often, the side of a metal sheet on which an undercut is located may be arranged to be exposed. That is, the side of a metal sheet on which an undercut is located may be an external surface of an apparatus or device. As such, the presence of an undercut on the side of the metal sheet may be aesthetically undesirable, e.g., when the metal sheet is arranged to serve a cosmetic purpose.

SUMMARY OF THE INVENTION

The invention pertains to a housing for an electronic device as well as methods for forming the housing. The housing can be formed from a substrate (material) having perforations to assist in adhering components internal to the housing. The substrate is typically a multi-layer substrate having at least two layers. In one embodiment, an inner layer of the multi-layer substrate can be provided with perforations. The perforations can them be used to adhere internal features (e.g., internal structures or attachment structures) to the multi-layer substrate. The internal features can be used for attaching parts or components to the multi-layer substrate, thereby securing (e.g., anchoring) the parts or components to the multi-layer substrate and thus the housing.

The invention may be implemented in numerous ways, including, but not limited to, as a method, system, device, or apparatus. Example embodiments of the present invention are discussed below.

As a method for forming an enclosure for a consumer electronic product, one embodiment can, for example, include at least the acts of: obtaining an inner layer and an outer layer; imposing a plurality of perforations to the inner layer; combining the perforated inner layer with the outer layer to form a multi-layer substrate; forming the enclosure for the consumer electronic product from the multi-layer substrate; and molding internal features onto the perforated inner layer of the enclosure.

As an assembly, one embodiment of the invention can, for example, include at least: a multi-layer substrate having at least a first layer and a second layer; a plurality of perforations provided in the first layer; and at least one structural feature adhered to the first layer at least in part by one or more of the perforations.

As a portable electronic device, one embodiment of the invention can, for example, include at least an electronic component, and a housing arranged to house the electronic component. The housing can include at least a multi-layer substrate having at least a first layer and a second layer, a plurality of perforations provided in the first layer, and at least one internal feature adhered to the first layer at least in part by one or more of the perforations.

As a housing for a portable electronic device, one embodiment of the invention can, for example include at least: a multi-layer substrate having at least a first layer and a second layer; a plurality of perforations provided in the first layer; and at least one internal feature formed on or attached to the first layer at least in part by one or more of the perforations.

Various aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, in which.

DETAILED DESCRIPTION OF THE INVENTION

Exemplary embodiments of the present invention are discussed below with reference to the various figures. However, those skilled in the art will readily appreciate that the detailed description given herein with respect to these figures is for explanatory purposes, as the invention extends beyond these embodiments.

The invention pertains to a housing for an electronic device as well as methods for forming the housing. The housing can be formed from a substrate (material) having perforations to assist in adhering components internal to the housing. The substrate is typically a multi-layer substrate having at least two layers. In one embodiment, an inner layer of the multi-layer substrate can be provided with perforations. The perforations can them be used to adhere internal features (e.g., internal structures or attachment structures) to the multi-layer substrate. The internal features can be used for attaching parts or components to the multi-layer substrate, thereby securing (e.g., anchoring) the parts or components to the multi-layer substrate and thus the housing.

In one embodiment, internal features can be adhered to an exposed surface of a multi-layer substrate. One or more internal features may be formed or attached to the multi-layer substrate. Examples of internal features include, but are not limited to: structural members, frames, screw bosses, bridges, snaps, flexures, flanges, shelves, tapers, cavities, and/or pockets.

In one embodiment, a multi-layer substrate having at least one metal layer may be a portion or a component of a housing of an electronic device. A multi-layer substrate that is a portion of a housing of an electronic device may be a bezel section, a front section, and/or a back section of the housing.

In one embodiment, the housing being formed from multi-layer substrates can be a metal part, housing, or sheet having multiple layers, where at least one of the layers is metal. The metal part, housing, or sheet may serve a structural and/or a cosmetic purpose. That is, an enclosure, housing, or sheet having multiple layers may have a purely structural purpose, a purely aesthetic purpose, or both a structural purpose and an aesthetic purpose. For ease of discussion, a metal part, housing or sheet will generally be described as a housing, although it should be appreciated that a metal element may be substantially any suitable metal component associated with a device or an apparatus, such as a housing, a sheet, or an insert.

The invention can be utilized in a variety of different devices (e.g., electronic devices) including, but not limited to including, portable and highly compact electronic devices (i.e., portable electronic devices) with limited dimensions and space. In one embodiment, a device may be a laptop computer, a tablet computer, a media player, a mobile phone (e.g., cellular phone), a personal digital assistant (PDA), substantially any handheld electronic device, a computer mouse, a keyboard, a remote control, substantially any computer accessory, and/or substantially any computer peripheral. Typically, the electronic devices include at least one electrical component inside its housing. The electrical component can, for example, be an integrated circuit or circuit board. Examples of integrated circuits include memory, processor (microprocessor or controller), ASIC, and various others.

Figure 1A:
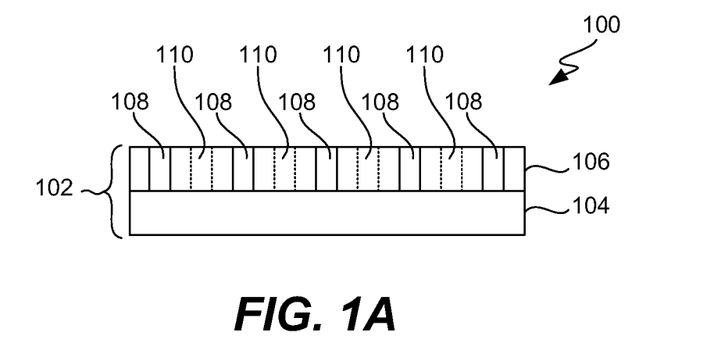
FIG. 1A is a cross-sectional side-view diagrammatic representation of a housing structure according to one embodiment of the invention.

FIG. 1A is a cross-sectional side-view diagrammatic representation of a housing structure 100 according to one embodiment of the invention. The housing structure 100 includes a multi-layer substrate 102. The multi-layer substrate 102 can, for example, represent a material that is suitable for use as an enclosure (e.g., housing) for an electronic device, such as a consumer electronic device.

The multi-layer substrate 102 has an outer layer 104 and an inner layer 106. The outer layer 104 can serve as the outer surface of the enclosure and can be referred to as a cosmetic layer (or cosmetic surface). The inner layer 106 is normally not visible once the enclosure (e.g., housing) for the electronic device is fabricated or assembled.

The inner layer 106 of the multi-layer substrate 100 also includes first perforations 108 and second perforations 110. The first perforations 108 and the second perforations 110 can be staggered. Hence, as illustrated in FIG. 1A, the first perforations 108 are exposed in the cross-sectional view, while the second perforations 110 are hidden (i.e., broken lines). As shown in FIG. 1A, the first perforations 108 and the second perforations 110 can extend completely through the inner layer 106. However, in other embodiments, the first perforations 108 and the second perforations 110 need not extend completely through the inner layer 106.

In one embodiment, the outer layer 104 and the inner layer 106 are separate metal layers that are pressed (e.g., clad) together to form the multi-layer substrate 102. In an alternative embodiment, the outer layer 104 and the inner layer 106 can be laminated together, such as in a multi-layer sheet. In still another embodiment, the outer layer 104 can be adhered to the inner layer 106 using a bonding action or an adhesive.

The outer layer 104 and the inner layer 106 of the multi-layer substrate 102 can be formed from the same or different materials. In one embodiment, the outer layer 104 and the inner layer 106 are both the same metal, such as stainless steel, cooper, or aluminum. In another embodiment, the outer layer 104 and the inner layer 106 can utilize different metals. For example, with regard to FIG. 1A, the outer layer 104 can be stainless steel, and the inner layer 106 can be aluminum. Since different metals can be used, the properties or characteristics of the different layers 104 and 106 having different metals can be advantageously utilized to form housings. For example, the outer layer 104 can be stainless steel, and the inner layer 106 can be aluminum. In addition, one or both of the outer layer 104 and the inner layer 106 can be a non-metal material. However, the non-metal materials need to withstand the subsequent processing of the multi-layer substrate to form the enclosure. Since different metals or other materials can be used, the properties or characteristics of the different layers 104 and 106 can be advantageously utilized to form housings.

Figure 1B:
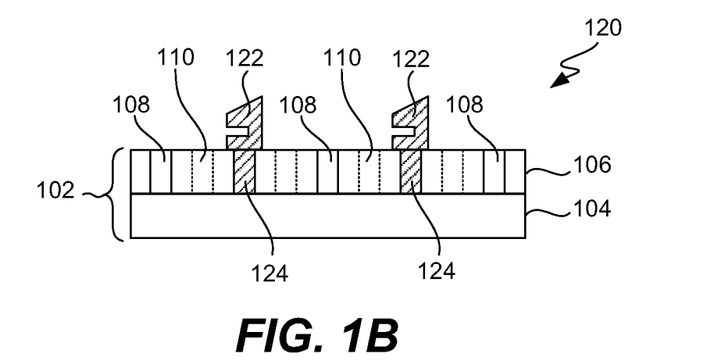
FIG. 1B is a cross-sectional side-view diagrammatic representation of a housing structure according to another embodiment of the invention.

FIG. 1B is a cross-sectional side-view diagrammatic representation of a housing structure 120 according to one embodiment of the invention. The housing structure 120 is similar to the housing structure 100 illustrated in FIG. 1A with the addition of internal features 122 attached to the multi-layer substrate 102. The internal features 122 can be adhered to the multi-layer substrate 102 through use of one or more embedded members 124. As illustrated in the cross-sectional side view shown in FIG. 1B, one or more of the embedded members 124 can be provided in one or more of the first perforations 108 and used to adhere the corresponding internal feature 122 to the multi-layer substrate 102 of the housing structure 120. In one implementation, the internal features 122 are formed on the inner layer 106 of the multi-layer substrate 102 and held securely to the inner layer 106 by the embedded member 124 provided within the corresponding one or more of the first perforations 108. In other words, the embedded member 124 provided within the corresponding one or more of the first perforations 108 serves to mechanically retrain the internal feature 122 to the multi-layer substrate, and thus the housing structure 120. In one implementation, one or more of the internal features 122 as well as the corresponding one or more embedded members 124 can be concurrently formed by molding process. As a particular example, for a given internal feature 122, the internal feature 122 and the corresponding one or more embedded members 124 can be injection molded such that the internal feature 122 and the corresponding one or more embedded members 124 can be integrally formed. Accordingly, the internal features 122 can be secured to the multi-layer substrate 102 by one or more corresponding embedded members 124 that are provided within one or more of the perforations 108, 110. In one embodiment, the internal features 122 and the embedded members 124 are plastic or resin features that can be molded (e.g., insert-molded, injection-molded) onto the inner layer 106.

The internal features 122 can be utilized as binding features or attachment features to assist in the assembly of a housing that utilizes one or more other parts that are to be attached or bounded to the housing structure 120. As illustrated in FIG. 1B, the internal features 122 can be geometrically complex internal features that are suitable for operation as binding features or attachment features.

Figure 1C:
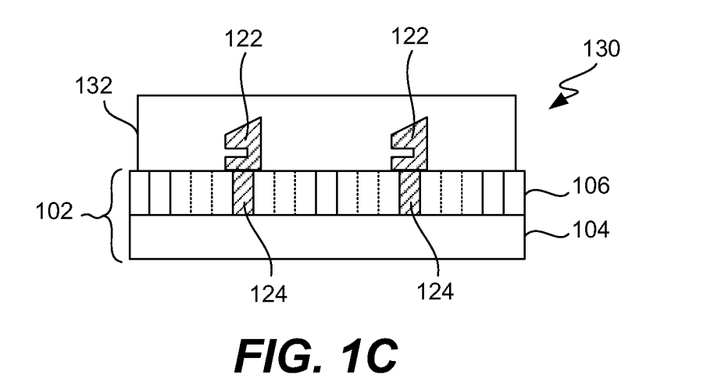
FIG. 1C is a cross-sectional side-view diagrammatic representation of a housing structure according to another embodiment of the invention.

FIG. 1C is a cross-sectional side-view diagrammatic representation of a housing structure 130 according to one embodiment of the invention. The housing structure 130 is similar to the housing structure 120 illustrated in FIG. 1B with the addition of an additional piece 132 bound to the multi-layer substrate 102. The additional piece 132 is adhered to the multi-layer substrate 102 through use of the internal features 122. The additional piece 132 can be a structural component or an electronic component. The additional piece 132 can be attached to, or effectively molded around, the internal features 122. If the additional piece 132 a structural component that is molded, the additional piece 132 can, for example, be formed by injection molding. The additional piece 132 may, in one embodiment, be arranged to include complex mechanical features (not shown) which can be complementary to the features 122. Although FIG. 1C illustrates the additional piece 132 being bound to the multi-layer substrate 102, it should be understood that, in general, one or more internal features can be bound to the multi-layer substrate 102 using one or more internal features 122.

Figure 1D:
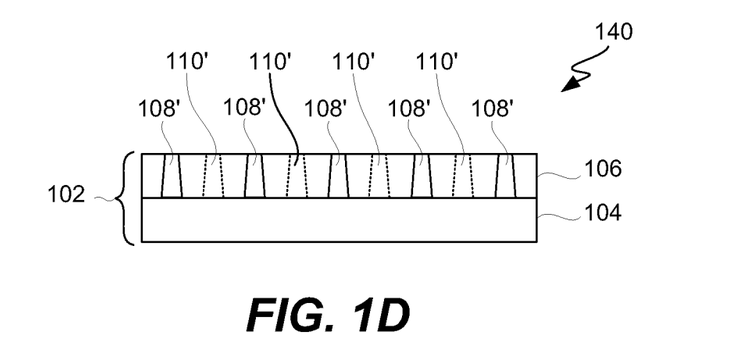
FIG. 1D is a cross-sectional side-view diagrammatic representation of a housing structure according to another embodiment of the invention.

FIG. 1D is a cross-sectional side-view diagrammatic representation of a housing structure 140 according to one embodiment of the invention. The housing structure 140 is similar to the housing structure 100 illustrated in FIG. 1A. The multi-layer substrate 102 has the outer layer 104 and the inner layer 106. The inner layer 106 of the multi-layer substrate 102 also includes first perforations 108' and second perforations 110' that are angled (e.g., tapered or trapezoidal) in shape. For example, the shape of the perforations 108' and 110' have an undercut profile as illustrated in FIG. 1D. Advantageously, the angled perforations can provide greater holding capability as compared to perforations that are straight (or not angled). The first perforations 108' and the second perforations 110' can also be staggered. As shown in FIG. 1D, the first perforations 108' and the second perforations 110' can extend completely through the inner layer 106. However, in other embodiments, the first perforations 108' and the second perforations 110' need not extend completely through the inner layer 106.

Figure 1E:
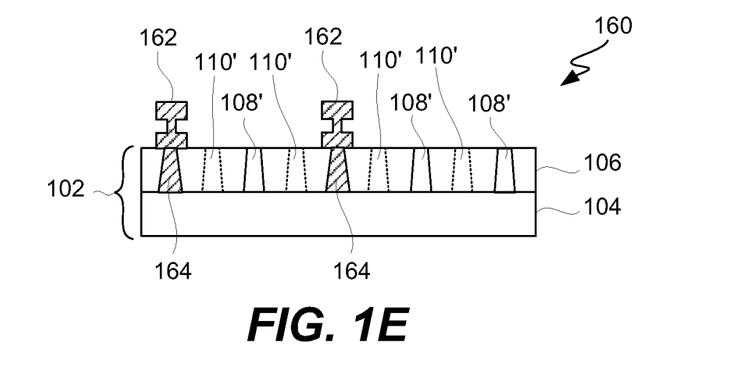
FIG. 1E is a cross-sectional side-view diagrammatic representation of a housing structure according to another embodiment of the invention.

FIG. 1E is a cross-sectional side-view diagrammatic representation of a housing structure 160 according to one embodiment of the invention. The housing structure 160 is similar to the housing structure 140 illustrated in FIG. 1D with the addition of internal features 162 attached to the multi-layer substrate 102. The internal features 162 can be adhered to the multi-layer substrate 102 through use of one or more embedded members 164. As illustrated in the cross-sectional side view shown in FIG. 1E, one or more of the embedded members 164 can be provided in one or more of the first perforations 108' and used to adhere the corresponding internal feature 162 to the multi-layer substrate 102 of the housing structure 160. In one implementation, the internal features 162 are formed on the inner layer 106 of the multi-layer substrate 102 and held securely to the inner layer 106 by embedded member 164 provided within the corresponding one or more of the first perforations 108. For example, the internal features 162 as well as the corresponding one or more embedded members 164 can be formed by molding process. As a particular example, for a given internal feature 162, the internal feature 162 and the corresponding one or more embedded members 164 can be injection molded such that the internal feature 162 and the corresponding one or more embedded members 164 can be integrally formed. Accordingly, the internal features 162 can be secured to the multi-layer substrate 102 by one or more corresponding embedded members 164 that extend into one or more of the perforations 108', 110'.

Figure 1F:
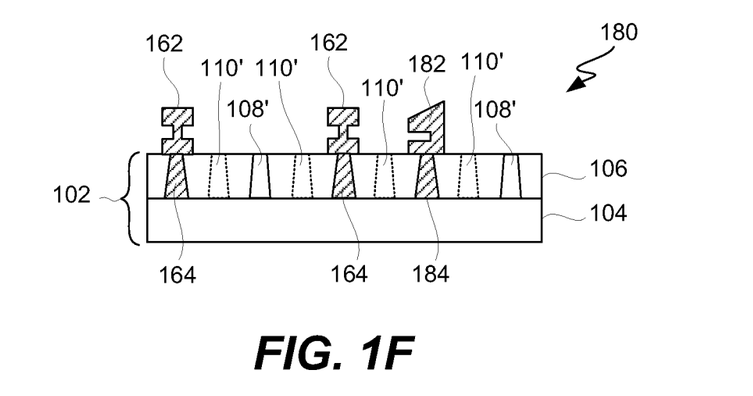
FIG. 1F is a cross-sectional side-view diagrammatic representation of a housing structure according to another embodiment of the invention.

FIG. 1F is a cross-sectional side-view diagrammatic representation of a housing structure 180 according to one embodiment of the invention. The housing structure 180 is similar to the housing structure 160 illustrated in FIG. 1E with the addition of one or more additional internal features 182 attached to the multi-layer substrate 102. Like the internal features 162, the one or more additional internal features 182 can be adhered to the multi-layer substrate 102 through use of one or more embedded members 184. As illustrated in the cross-sectional side view shown in FIG. 1F, one or more of the embedded members 184 can be provided in one or more of the first perforations 108' and used to adhere the corresponding internal feature 182 to the multi-layer substrate 102 of the housing structure 160. The various internal features 162, 182 being utilized can have different geometries. For example, the internal features 162 have one geometry, while the internal feature has another different geometry.

Figure 1G:
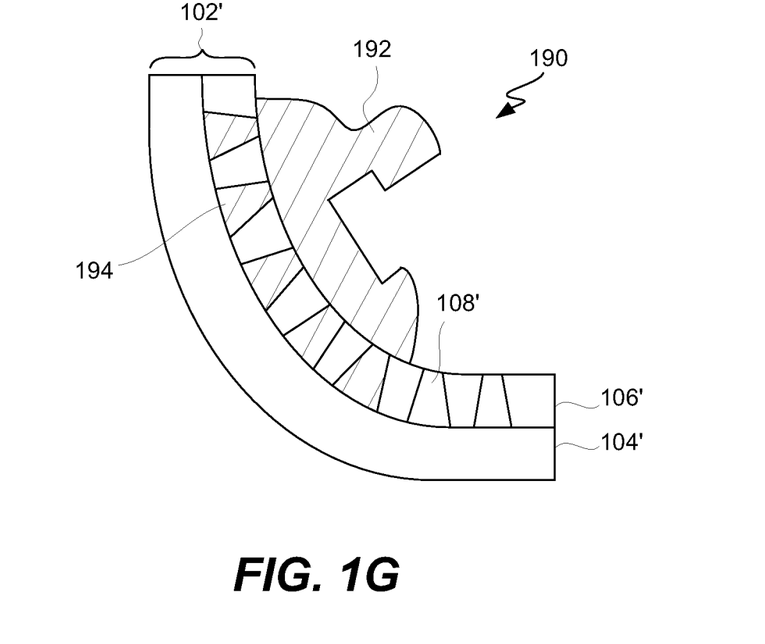
FIG. 1G is a cross-sectional side-view diagrammatic representation of a housing structure according to another embodiment of the invention.

FIG. 1G is a cross-sectional side-view diagrammatic representation of a housing structure 190 according to one embodiment of the invention. The housing structure 190 is similar to the housing structure 140 illustrated in FIG. 1D although at least an illustrated portion of the multi-layer substrate 102' of the housing structure 190 is curved. The outer layer 104' and the inner layer 106' are also curved. The inner layer 106' also includes the perforations 108'. The housing structure 190 illustrated in FIG. 1G also has an internal features 192 adhered to the multi-layer substrate 102' through use of one or more embedded members 194.

FIGS. 2A-2D are partial top views of multi-layer substrates according to one embodiment of the invention. The partial top views illustrated in FIGS. 2A-2D illustrate inner-layers of the multi-layer substrates having a plurality of perforations. The perforations in the different multi-layer substrates have different arrangements or shapes. The multi-layer substrates illustrated in FIGS. 2A-2D are, for example, suitable for use as the multi-layer substrate 102 in FIGS. 1A-1F.

Figure 2A:
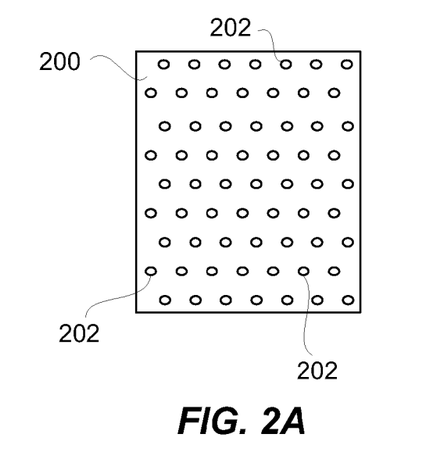
FIGS. 2A-2D are partial top views of multi-layer substrates according to one embodiment of the invention.

FIG. 2A is a partial top view of a multi-layer substrate 200 according to one embodiment of the invention. The multi-layer substrate 200 has a plurality of circular perforations 202. In this embodiment, the circular perforations 202 are arranged in a uniform pattern of offset rows. Further, in this embodiment, the circular perforations 202 are uniformly provided across an inner-layer of the multi-layer substrate 200.

Figure 2B:
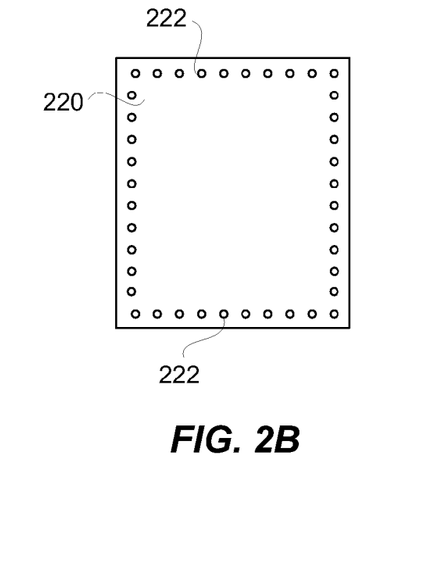

FIG. 2B is a partial top view of a multi-layer substrate 220 according to another embodiment of the invention. The multi-layer substrate 220 has a plurality of circular perforations 222 arranged in a pattern. For example, the circular perforations 222 can be provided on the inner-layer around the outer peripheral portion of the multi-layer substrate 220. The pattern of these circular perforations 222 provided on the multi-layer substrate 220 is in a box configuration. It should be noted, however, that the pattern of the circular perforations 222 can take any of a wide variety of patterns.

Figure 2C:
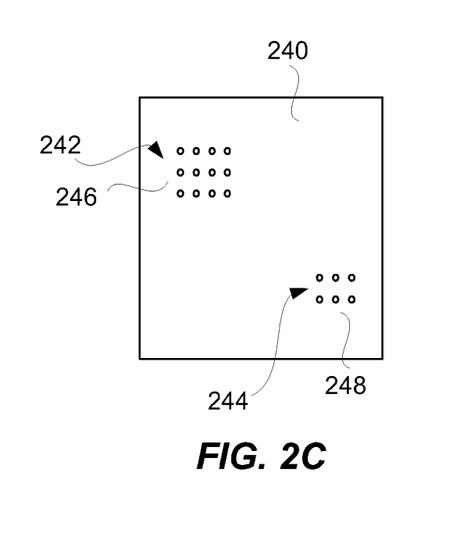

FIG. 2C is a partial top view of a multi-layer substrate 240 according to another embodiment of the invention. The multi-layer substrate 240 has a plurality of circular perforations 242 provided at a first region 246 of the inner-layer of the multi-layer substrate, and a plurality of circular perforations 244 provided at a second region 248 of the inner-layer of the multi-layer substrate. For example, as illustrated in FIG. 2C, the set of perforations 242 can be provided at the first region 246 to facilitate attachment of one and more internal features to that location of the multi-layer substrate 240. Similarly, the set of perforations 244 can be provided at the second region 248 to facilitate attachment of one or more other internal features to that location of the multi-layer substrate 240.

Figure 2D:
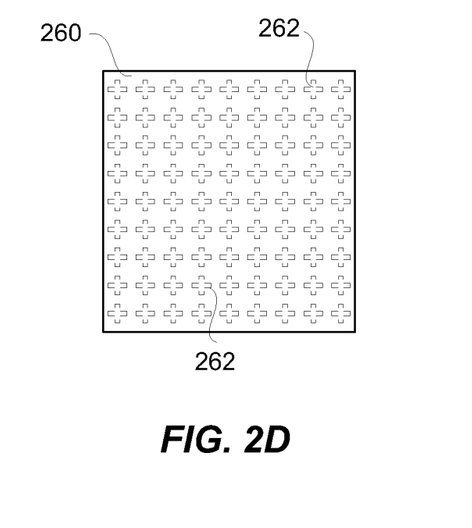

FIG. 2D is a partial top view of a multi-layer substrate 260 according to still another embodiment of the invention. The multi-layer substrate 260 has a plurality of perforations 262. The perforations 262 illustrated in FIG. 2D are plus-shaped. Hence, the shape of the perforations can, in general, vary with implementation. For example, the perforations can not only be circular or plus-shaped but also square, oval, trapezoidal, triangular, star-shaped and many more. The geometric complexity of the shapes can range from relatively simple (e.g., circular, oval, square) to relatively complex (e.g., plus-shaped, star-shaped). Moreover, although all the perforations 262 illustrated in FIG. 2D are plus-shaped, the perforations on the multi-layer sheet need not be all the same shape but can be a mixture of different shapes.

Figure 3:
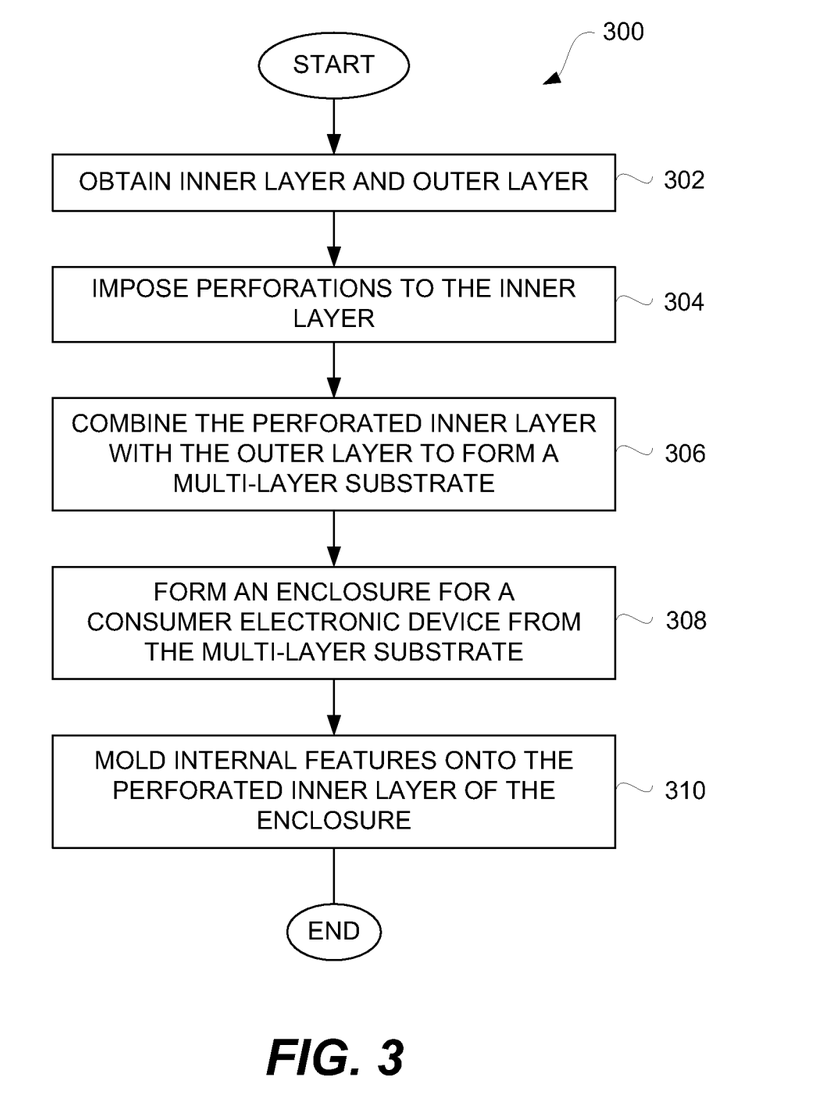
FIG. 3 is a flow diagram of an enclosure manufacturing process according to one embodiment of the invention.

FIG. 3 is a flow diagram of an enclosure manufacturing process according to one embodiment of the invention. In the enclosure manufacturing process 300 operates to produce a multi-layer substrate that can be utilized as an enclosure for a consumer electronic device. The multi-layer substrate can, for example, represent the multi-layer structure 102, 102' of any of the housing structures 100, 120, 130, 140, 160, 180 and 190 illustrated in FIGS. 1A-1G.

The enclosure manufacturing process 300 can initially obtain 302 an inner layer and an outer layer for the enclosure to be manufactured. Next, perforations can be imposed 304 to the inner-layer. The perforations are, in one embodiment, small holes that extend through the inner layer. The diameter of the holes can, in one implementation, be approximately 1-5 mm in diameter. In another implementation, the diameter of the holes can be approximately 2-3 mm in diameter. As noted above, the geometric shape of the perforations can vary (e.g., circular, oval, star-shaped, plus shaped, etc.). In one embodiment, the perforations can be imposed 304, i.e., formed, by passing the inner layer through a rolling press. In another embodiment, the perforations can be imposed 304 by chemically removing portions of the inner layer to yield the perforations. For example, chemical removal of portions can be performed by a chemical etch process. In still another embodiment, the perforations can be imposed 304, i.e., formed, by being laser-etched. Alternatively, in another embodiment, the inner layer can be obtained such that the perforations are already formed therein.

The perforated inner-layer can then be combined 306 with the outer layer to form a multi-layer substrate. The inner layer and the outer layer can be pressed (e.g., clad) together, laminated together, or adhered together. Thereafter, using the multi-layer substrate, an enclosure for a consumer electronic device can be formed 308 from the multi-layer substrate. In one implementation, the enclosure can be formed 308 through a mechanical process, such as stamping, punching, pressing and the like.

Once the enclosure for the consumer electronic device has been formed 308, one or more internal features can be molded 310 onto the perforated inner-layer of the enclosure. Advantageously, these one or more internal features can be molded to the inner-layer with a single molding tool. In other words, multiple internal features can be formed by a single molding tool all without having to remove the enclosure to form the different internal features. These one more internal features can be formed singly or concurrently by use of the single molding tool. The internal features formed within housing structures are utilized to bind the other components to the housing structure, and thus the consumer electronic device. For example, the internal features can serve to mechanically constrain internal parts to the enclosure. The other components and/or internal parts can be structural components or electronic components. Following the molding 310 of the one or more internal features to the enclosure, the enclosure manufacturing process 310 can end.

Additional information on housings having multiple layers can be found in: (i) U.S. patent application Ser. No. 11/964,652, filed on Dec. 26, 2007, entitled "Methods and Systems for Forming a Dual Layer Housing", which is incorporated herein by reference for all purposes; (ii) U.S. Provisional Patent Application No. 60/949,780, filed on Jul. 13, 2007, entitled "Dual Layer Housing", which is incorporated herein by reference for all purposes; and (iii) U.S. Provisional Patent Application No. 61/023,375, filed on Jan. 24, 2008, entitled "Method and Systems for Forming Housings from Multi-layer Materials", which is incorporated herein by reference for all purposes.

The many features and advantages of the present invention are apparent from the written description. Further, since numerous modifications and changes will readily occur to those skilled in the art, the invention should not be limited to the exact construction and operation as illustrated and described. Hence, all suitable modifications and equivalents may be resorted to as falling within the scope of the invention.

The invention claimed is:

1. A method for securing a feature to a curved surface of an enclosure, comprising:
    positioning portions of a feature within perforations of the enclosure, the perforations penetrating through an inner curved surface of the enclosure and not through an outer curved surface of the enclosure, the outer curved surface corresponding to an outer surface of the enclosure, wherein the feature covers at least a portion of the inner curved surface, and wherein the perforations have undercut geometries that engage with the portions of the feature positioned within the perforations so as to create a multi-axis force that secures the feature to the inner curved surface.

2. The method of claim 1, wherein the feature is composed of plastic.

3. The method of claim 1, wherein at least one of the perforations has a diameter ranging from about 1 millimeter and 5 millimeters.

4. The method of claim 1, wherein the perforations are formed in a staggered geometry within the enclosure.

5. The method of claim 1, further comprising:
forming a shape of the feature.

6. The method of claim 1, wherein the enclosure comprises a multi-layer substrate having at least a first layer and a second layer, wherein the perforations penetrate through the first layer and not through the second layer.

7. The method of claim 6, wherein depositing the portions of the feature within the perforations comprises contacting the portions of the feature with the second layer.

8. The method of claim 6, further comprising:
forming the perforations within the first layer prior to coupling the first layer and the second layer.

9. The method of claim 1, wherein the enclosure is for a portable electronic device.

10. A method of forming an enclosure for an electronic device, the method comprising:
coupling a feature to the enclosure, the enclosure defining an inner curved surface and an outer curved surface, the outer curved surface corresponding to an outer surface of the enclosure, wherein the enclosure has perforations that penetrate through the inner curved surface and not through the outer curved surface, wherein coupling the feature to the enclosure includes:
inserting portions of the feature within the perforations, wherein the perforations have undercut geometries configured to engage with the portions of the feature inserted with the perforations, thereby providing a multi-axis securing force that secures the feature to the inner curved surface of the enclosure.

11. The method of claim 10, wherein the enclosure comprises a multi-layer substrate having at least a first layer and a second layer, wherein the perforations penetrate through the first layer and not through the second layer.

12. The method of claim 10, further comprising:
applying an additional piece over the feature, thereby securing the additional piece to the enclosure.

13. The method of claim 10, wherein the at least one of the perforations has a diameter ranging from about 1 millimeter and 5 millimeters.

14. The method of claim 10, wherein the inner curved surface is a concave surface.

15. The method of claim 10, wherein the enclosure includes a first layer and a second layer, wherein the perforations penetrate through the first layer and not through the second layer, wherein the portions of the feature within the perforations contact the second layer.

16. A method of forming a feature on an enclosure for an electronic device, the method comprising:
forming perforations having undercut geometries within the enclosure, the enclosure having an inner curved surface and an outer curved surface, wherein the outer curved surface corresponds to an outer surface of the enclosure, and the perforations penetrate through the inner curved surface and not through the outer curved surface; and
inserting portions of the feature within the perforations, thereby providing a multi-axis securing force that secures the feature to the inner curved surface of the enclosure.

17. The method of claim 16, wherein the feature is composed of plastic.

18. The method of claim 16, wherein the enclosure includes a first layer and a second layer, wherein the perforations penetrate through the first layer and not through the second layer.

19. The method of claim 18, wherein the portions of the feature within the perforations contact the second layer.

20. The method of claim 19, wherein the inner curved surface is a concave surface.

* * * * *